[12] United States Patent
Hong et al.

(10) Patent No.: US 9,311,984 B1
(45) Date of Patent: Apr. 12, 2016

(54) SMART REFRESH DEVICE

(71) Applicant: SK hynix Inc., Icheon-si Gyeonggi-do (KR)

(72) Inventors: Duck Hwa Hong, Seoul (KR); Sang Il Park, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/574,900

(22) Filed: Dec. 18, 2014

(30) Foreign Application Priority Data

Sep. 23, 2014 (KR) .................. 10-2014-0127063

(51) Int. Cl.
*G11C 11/406* (2006.01)
*G11C 11/408* (2006.01)
*G11C 17/16* (2006.01)

(52) U.S. Cl.
CPC ............ *G11C 11/406* (2013.01); *G11C 11/408* (2013.01); *G11C 17/16* (2013.01)

(58) Field of Classification Search
None
See application file for complete search history.

(56) References Cited

U.S. PATENT DOCUMENTS

| 7,609,569 | B2 | 10/2009 | Fragano et al. | |
| 2014/0006703 | A1* | 1/2014 | Bains | G11C 11/40618 711/106 |

FOREIGN PATENT DOCUMENTS

KR   100924355   B1   11/2009

* cited by examiner

*Primary Examiner* — James G Norman
(74) *Attorney, Agent, or Firm* — William Park & Associates Ltd.

(57) ABSTRACT

A smart refresh device includes an address control block configured to determine whether a specific row address is a row hammer address, and invert a first row hammer address and perform an addition/subtraction of an address; a repair control block configured to determine whether the row hammer address is a repaired address and output a stored repair address as a second repair control signal; a repair address storage block configured to store an output address of the address control block and output a stored address as a latch address; a fuse block configured to output a repair signal representing information on a repair address to the repair control block, and output a decoding signal according to the latch address; and an operator configured to add and subtract the decoding signal according to an addition signal and a subtraction signal.

20 Claims, 14 Drawing Sheets

SMART REFRESH DEVICE

CROSS-REFERENCES TO RELATED APPLICATION

The present application claims priority under 35 U.S.C. §119(a) to Korean application number 10-2014-0127063, filed on Sep. 23, 2014, in the Korean Intellectual Property Office, which is incorporated herein by reference in its entirety.

BACKGROUND

1. Technical Field

Various embodiments generally relate to a smart refresh device, and more particularly, to a technology for detecting a repair address and performing smart refresh, thereby improving a refresh characteristic.

2. Related Art

In general, a semiconductor memory device includes a number of memory cells. As processing technologies have been developed and thus the degree of integration is augmented, the number of memory cells gradually increases. If a fail occurs in even any one among memory cells, a corresponding semiconductor memory device misoperates. Therefore, since the semiconductor memory device including a failed cell cannot perform a desired operation, it should be discarded.

Meanwhile, as the degree of integration of a memory increases, an interval between the plurality of word lines included in the memory is reduced. As the interval between the word lines is reduced, a coupling effect between adjacent word lines increases.

Every time data is inputted and outputted to and from a memory cell, a word line toggles between an activated (active) state and a deactivated (inactive) state. In this regard, as the coupling effect between adjacent word lines increases as described above, a phenomenon occurs, in which the data of a memory cell coupled with a word line adjacent to a frequently activated word line is damaged.

Such a phenomenon is called word line disturbance. Due to the word line disturbance, a phenomenon occurs in which the data of a memory cell is damaged before the memory cell is refreshed.

In order to prevent the degradation of data due to the word line disturbance, a method for detecting a word line of which the number of activation times is large and then preventing the degradation of the data of the pluralities of memory cells electrically coupled to word lines adjacent to the detected word line is needed.

SUMMARY

In an embodiment, a smart refresh device may include an address control block configured to determine and store whether a specific row address is a row hammer address, and invert a first row hammer address and perform an addition/subtraction of an address. The smart refresh device may also include a repair control block configured to determine and store whether the row hammer address is a repaired address when a first smart refresh signal is activated, and output a stored repair address as a second repair control signal, when a second smart refresh signal is activated. The smart refresh device may also include a repair address storage block configured to store an output address of the address control block when the first smart refresh signal is activated, and output a stored address as a latch address when the second repair control signal is activated. The smart refresh device may also include a fuse block configured to output a repair signal representing information on a repair address to the repair control block, and output a decoding signal according to the latch address. The smart refresh device may also include an operator configured to add and subtract the decoding signal according to an addition signal and a subtraction signal when the second repair control signal is activated.

In an embodiment, a smart refresh device may include an address control block configured to generate a row address according to an address and a smart refresh signal, and output the row address to a repair address storage block and an addition/subtraction signal generation block. The smart refresh device may also include a repair control block configured to output a repair control signal according to the smart refresh signal, an active signal, a bank select signal, and a repair signal. The smart refresh device may also include the repair address storage block configured to output a latch address to a fuse block according to a repair control signal, the active signal, and the row address. Further, the smart refresh device may also include the fuse block configured to output the decoding signals according to the latch address.

DETAILED DESCRIPTION

Hereinafter, a smart refresh device will be described below with reference to the accompanying drawings through various embodiments. Various embodiments are directed to a smart refresh device capable of detecting a repair address and performing smart refresh, thereby improving a refresh characteristic.

Figure 1:
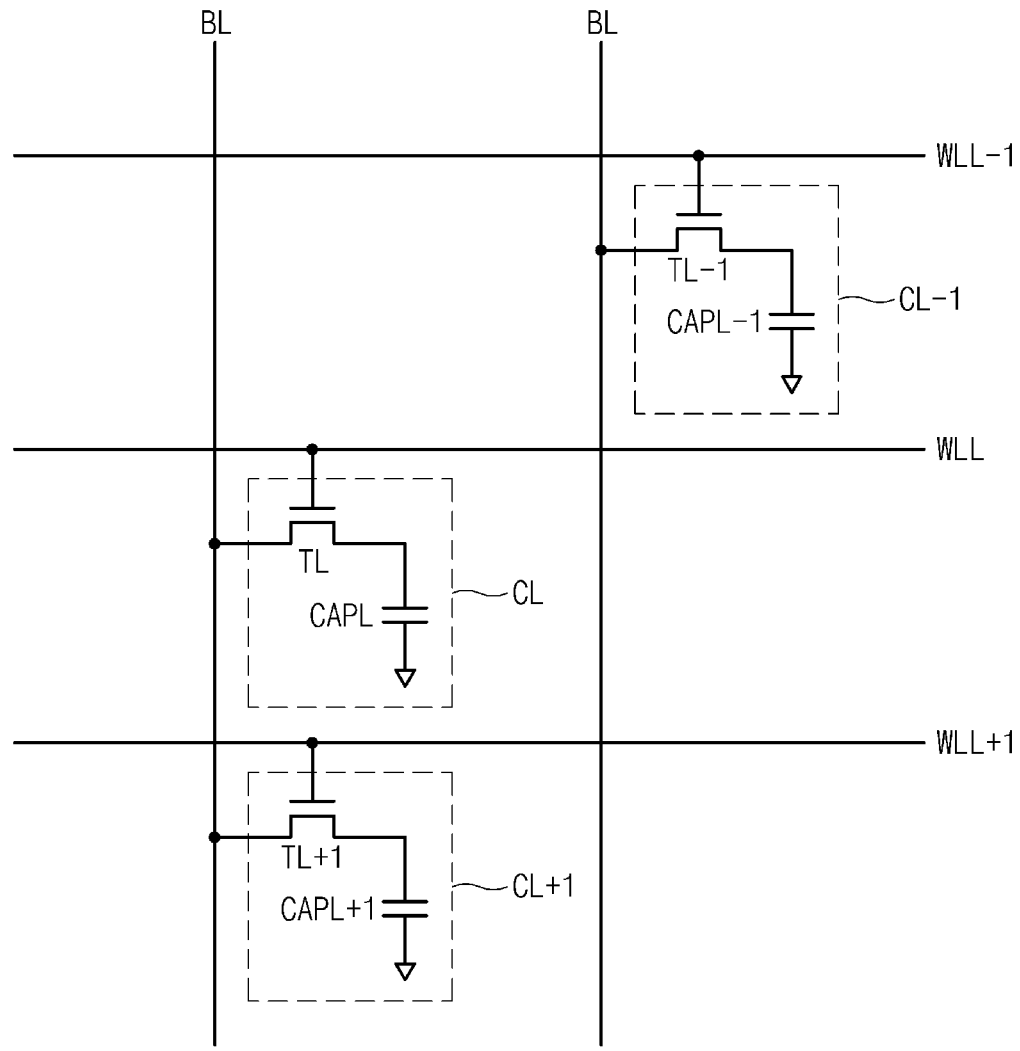
FIG. 1 is a diagram illustrating a part of a cell array included in a memory, explaining a word line disturbance phenomenon.

FIG. 1 is a diagram illustrating a part of a cell array included in a memory, explaining a word line disturbance phenomenon.

In FIG. 1, WLL corresponds to a word line having a large number of activation times, and WLL−1 and WLL+1 correspond to word lines which are disposed adjacent to the word line WLL, that is, word lines which are adjacent to a word line having a large number of activation times.

Furthermore, CL indicates a memory cell coupled with the word line WLL, CL−1 indicates a memory cell coupled with the word line WLL−1, and CL+1 indicates a memory cell coupled with the word line WLL+1. The respective memory cells CL, CL−1 and CL+1 include cell transistors TL, TL−1 and TL+1 and cell capacitors CAPL, CAPL−1 and CAPL+1.

In FIG. 1, when the word line WLL is activated or deactivated, a coupling phenomenon occurs between the word line WLL and the adjacent word lines WLL−1 and WLL+1. Due to this fact, as the voltages of the adjacent word lines WLL−1 and WLL+1 are increased or decreased, an influence is exerted on the amounts of charges of the cell capacitors CAPL−1 and CAPL+1.

Therefore, in the case where the activation of the word line WLL frequently occurs and the word line WLL toggles between an activated state and a deactivated state, changes in the amounts of charges stored in the cell capacitors CAPL−1 and CAPL+1 included in the memory cells CL−1 and the CL+1 increase, so the data of the memory cells CL−1 and the CL+1 may be degraded.

Moreover, as electromagnetic waves, which are generated while the word line toggles between the activated state and the deactivated state, introduce or discharge electrons into or from the cell capacitors of the memory cells coupled with the adjacent word lines, data are likely to be damaged.

Figure 2:
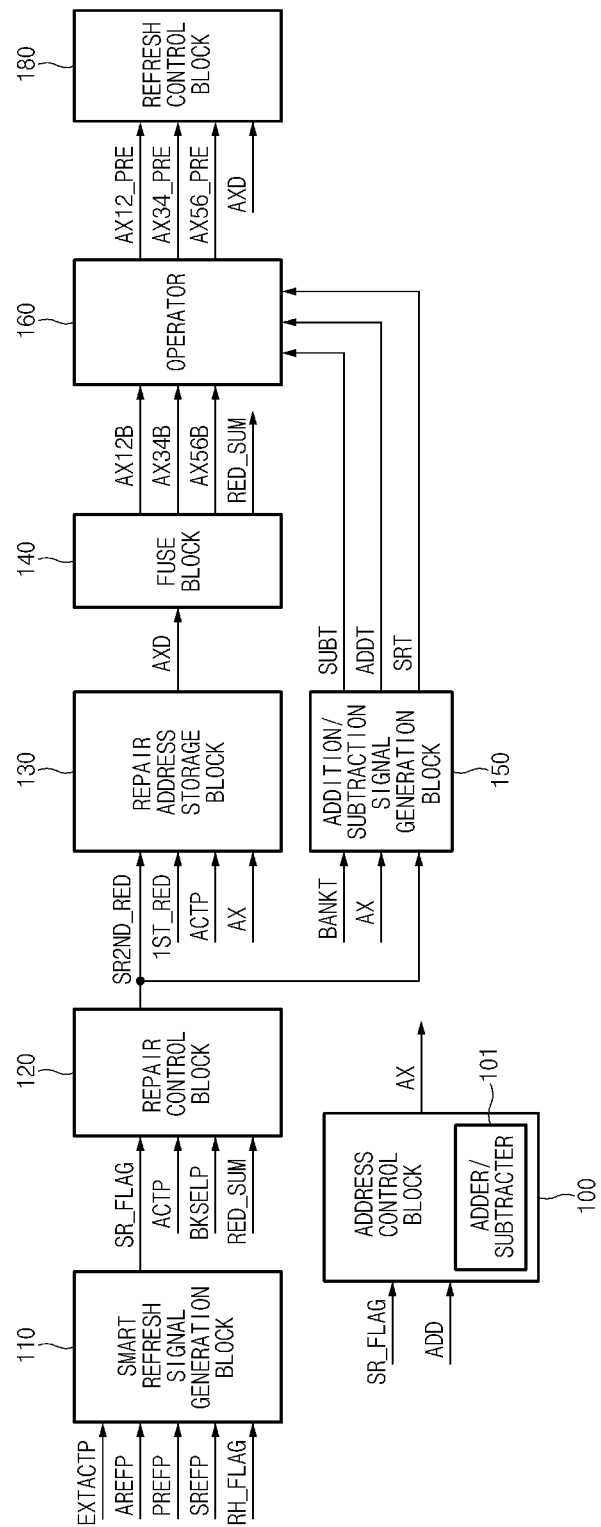
FIG. 2 is a configuration diagram illustrating a representation of an example of a smart refresh device in accordance with an embodiment.

Referring to FIG. 2, a configuration diagram illustrating a representation of an example of a smart refresh device in accordance with an embodiment is shown.

A smart refresh device includes an address control block 100, an adder/subtracter 101, a smart refresh signal generation block 110, a repair control block 120, a repair address storage block 130, a fuse block 140, an addition/subtraction signal generation block 150, an operator 160, and a refresh control block 180.

The address control block 100 generates a row address AX according to an address ADD and a smart refresh signal SR_FLAG which are inputted thereto. The address control block 100 also outputs the row address AX to the repair address storage block 130 and the addition/subtraction signal generation block 150. More specifically, the address control block 100 samples a specific row address ADD in synchronization with a clock generated by an oscillator.

The address control block 100 inverts an address corresponding to the row address AX<0> based on the sampled address. The row address AX<0> corresponds to a first row hammer address among a plurality of row addresses <0:N>.

Adjacent word lines of the first row hammer address are refreshed. If the row address AX<0> is logic "0," the first row hammer address becomes N+1, and, if the row address AX<0> is logic "1," the first row hammer address becomes N−1.

The smart refresh signal generation block 110 outputs the smart refresh signal SR_FLAG according to an external active signal EXTACTP, refresh signals AREFP, PREFP and SREFP and a flag signal RH_FLAG.

The refresh signal PREFP is a pulse signal generated by a per-bank refresh command, the refresh signal AREFP is a pulse signal generated by an auto refresh command, and the refresh signal SREFP is a pulse signal generated by a self refresh command.

The repair control block 120 outputs a repair control signal SR2ND_RED according to the smart refresh signal SR_FLAG, an active signal ACTP, a bank select signal BKSELP and a repair signal RED_SUM.

As technology shrink advances and the pitch between adjacent word lines gradually decreases, loss of data and degradation of a refresh characteristic are likely to be caused due to row hammering. Row hammering means that, where a specific row line is repeatedly activated and precharged, a refresh fail occurs in a word line adjacent to and lying over or under a target word line and the cell data of the adjacent word line is lost.

To cope with this problem, if a user repeatedly activates and precharges a word line of a specific address, a specific row line repeatedly activated is sampled and stored in the address control block 100. If a next refresh command is applied, word lines N−1 and N+1 adjacent to and lying over and under the specific row line are refreshed through the adder/subtracter 101, which is referred to as smart refresh. The smart refresh signal SR_FLAG is a flag signal for performing such a smart refresh operation.

Where a sampled row line is a normal word line, it is possible to access adjacent overlying and underlying word lines through the adder/subtracter 101. However, in where a sampled row line is a repair word line, overlying and underlying word lines are replaced with repair word lines. Therefore, although one word line of an N−1 word line and an N+1 word line is accessible, it is impossible to physically access the other word line.

Under these situations, in an embodiment, where a sampled address represents a repaired word line, the repair control block 120 detects this and internally refreshes a physical word line.

The repair address storage block 130 outputs a latch address AXD to the fuse block 140 according to the repair control signal SR2ND_RED, a repair control signal 1ST_RED, the active signal ACTP and the row address AX. The repair control signal 1ST_RED corresponds to a first repair control signal. Further, the repair control signal SR2ND_RED corresponds to a second repair control signal. Such a repair address storage block 130 stores the row address AX where the row address AX is a repair address.

When a second smart refresh signal SR_FLAG(2ND) is activated, the N+1 word line or the N−1 word line is refreshed. Where a first row hammer address represents a repair word line, the repair control signal SR2ND_RED is activated, a stored first row address is selected by neglecting a second row address, and the latch address AXD is outputted.

The fuse block 140 outputs the repair signal RED_SUM which represents information on a repair address, to the repair control block 120. Further, the fuse block 140 outputs decoding signals AX12B, AX34B and AX56B in correspondence to the latch address AXD. The decoding signal AX12B is a signal generated by decoding row address bits A1 and A2. The decoding signal AX34B is a signal generated by decoding row address bits A3 and A4. The decoding signal AX56B is a signal generated by decoding row address bits A5 and A6.

The addition/subtraction signal generation block 150 outputs a subtraction signal SUBT, an addition signal ADDT and a smart refresh command signal SRT to the operator 160 in correspondence to a bank activation signal BANKT and the repair control signal SR2ND_RED.

The operator 160 adds or subtracts the decoding signals AX12B, AX34B and AX56B in correspondence to the subtraction signal SUBT, the addition signal ADDT and the smart refresh command signal SRT, and outputs addresses AX12_PRE, AX34_PRE and AX56_PRE. If the row address AX<0> as the first row hammer address is logic "0," the decoding signals AX12B, AX34B and AX56B are subtracted. Conversely, if the row address AX<0> is logic "1," the decoding signals AX12B, AX34B and AX56B are added.

The refresh control block 180 performs a refresh operation in correspondence to the latch address AXD where a row hammer address is not a repair address when a first smart refresh signal SR_FLAG(1ST) is activated. The refresh control block 180 performs a refresh operation in correspondence to the addresses AX12_PRE, AX34_PRE and AX56_PRE where a row hammer address is a repair address when the second smart refresh signal SR_FLAG(2ND) is activated.

Figure 3:
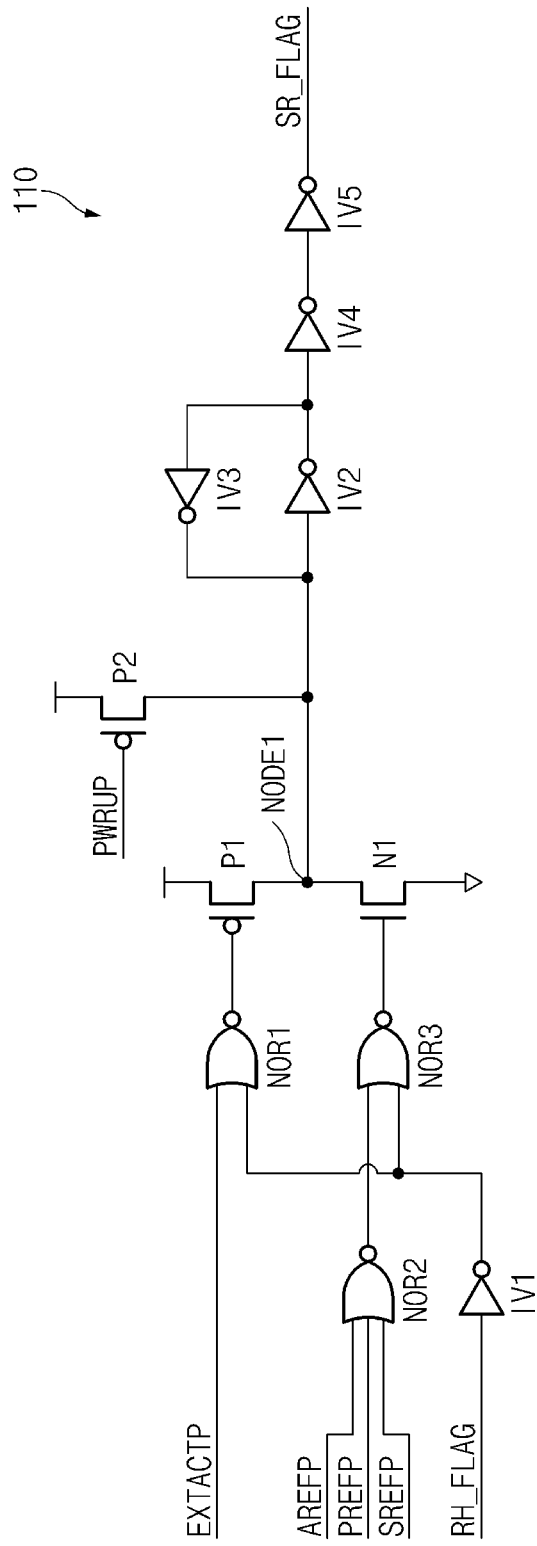
FIG. 3 is a detailed circuit diagram illustrating a representation of an example of the smart refresh signal generation block shown in FIG. 2.

Referring to FIG. 3, a detailed circuit diagram illustrating a representation of an example of the smart refresh signal generation block 110 shown in FIG. 2 is illustrated.

The smart refresh signal generation block 110 includes a plurality of NOR gates NOR1 to NOR3, a plurality of inverters IV1 to IV5, PMOS transistors P1 and P2, and an NMOS transistor N1.

The NOR gate NOR1 NORs or performs a NOR logic function on the external active signal EXTACTP and an inverted flag signal generated by inverting the flag signal RH_FLAG by the inverter IV1. The NOR gate NOR2 NORs or performs a NOR logic function on the refresh signals AREFP, PREFP and SREFP. The NOR gate NOR3 NORs or performs a NOR logic function on the output of the NOR gate NOR2 and the inverted flag signal generated by inverting the flag signal RH_FLAG by the inverter IV1.

The PMOS transistor P1 and the NMOS transistor N1 are electrically coupled in series between a power supply terminal and a ground terminal. The PMOS transistor P1 is applied with the output of the NOR gate NOR1 through the gate terminal thereof. Further, the NMOS transistor N1 is applied with the output of the NOR gate NOR3 through the gate terminal thereof.

The PMOS transistor P2 is electrically coupled between the power supply terminal and a node NODE1, and applied with a power-up signal PWRUP through the gate terminal thereof. The inverters IV2 and IV3, which are electrically coupled in a latch structure, latch the output of the node NODE1. The inverters IV4 and IV5 non-invertingly delay the output of the inverter IV2, and output the smart refresh signal SR_FLAG.

Such a smart refresh signal generation block 110 activates and outputs the smart refresh signal SR_FLAG where the flag signal RH_FLAG is a high level and at least any one of the refresh signals AREFP, PREFP and SREFP is at a high level. Conversely, in the smart refresh signal generation block 110, the PMOS transistor P1 is turned on where the external active signal EXTACTP is activated to a high level. Accordingly, the node NODE1 becomes a high level, and the smart refresh signal SR_FLAG is deactivated to a low level.

Figure 4:
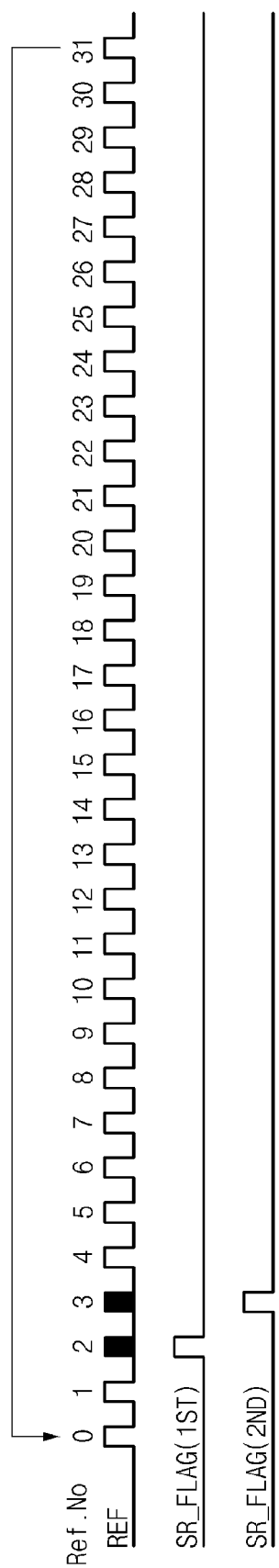
FIG. 4 is a representation of an example of a diagram to assist in the explanation of the smart refresh signal shown in FIGS. 2 and 3.

Referring to FIG. 4, a representation of an example of a diagram to assist in the explanation of the smart refresh signal SR_FLAG shown in FIGS. 2 and 3 is illustrated.

A refresh command REF toggles to a high level and a low level in synchronization with clocks generated by a counter.

The first smart refresh signal SR_FLAG(1ST) is activated as a pulse signal with a high level in synchronization with the refresh command REF. For example, the first smart refresh signal SR_FLAG(1ST) may be activated in synchronization with a third refresh command REF.

Similarly, the second smart refresh signal SR_FLAG(2ND) is activated as a pulse signal with a high level in synchronization with the refresh command REF. For example, the second smart refresh signal SR_FLAG(2ND) may be activated in synchronization with a fourth refresh command REF.

The flag signal RH_FLAG is a pulse signal which becomes a high level in correspondence to the third refresh command REF and the fourth refresh command REF. In an embodiment, it will be described as an example that the first smart refresh signal SR_FLAG(1ST) is activated 1 clock earlier than the second smart refresh signal SR_FLAG(2ND).

Figure 5:
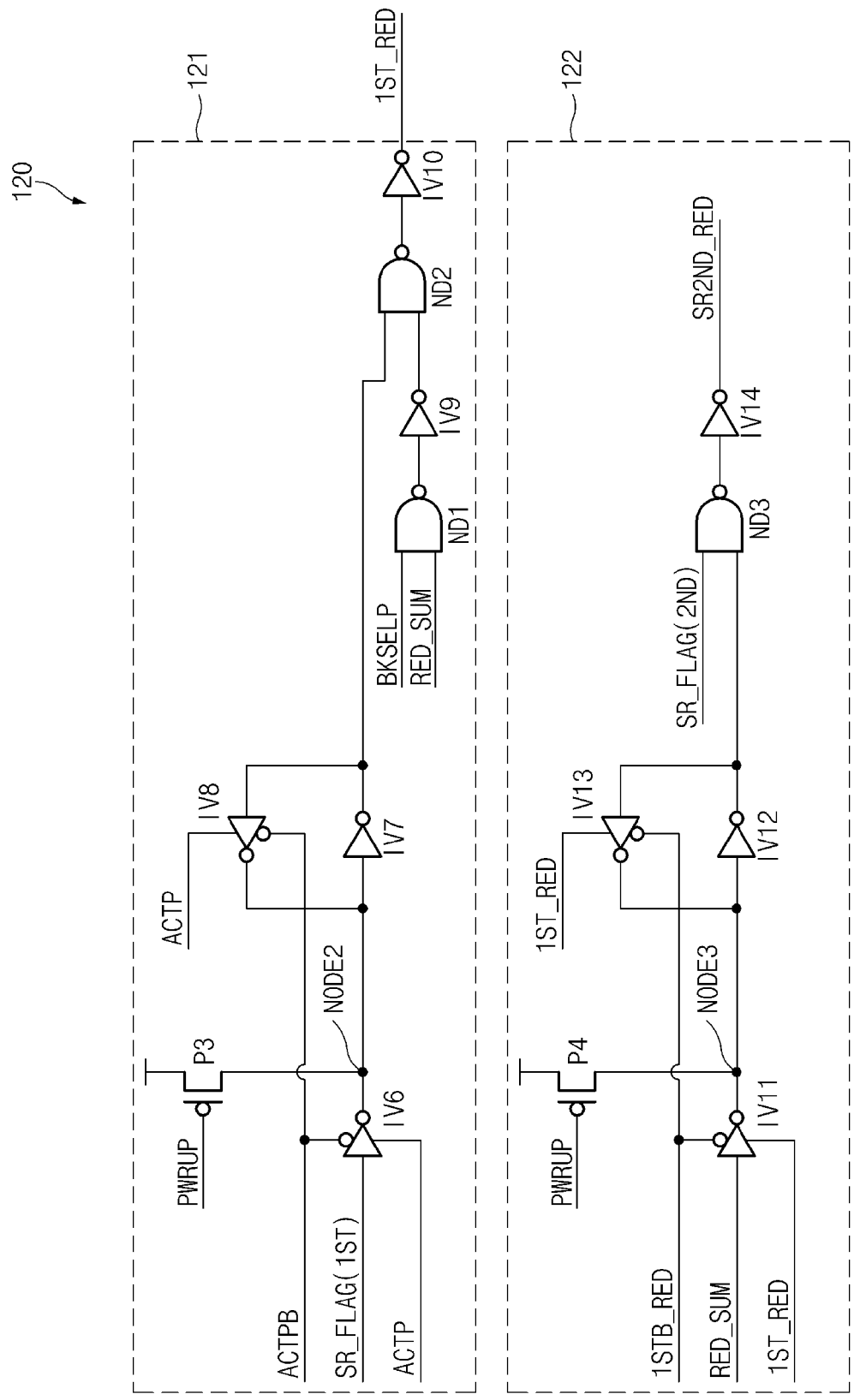
FIG. 5 is a detailed circuit diagram illustrating a representation of an example of the repair control block shown in FIG. 2.

Referring to FIG. 5, a detailed circuit diagram illustrating a representation of an example of the repair control block 120 shown in FIG. 3 is illustrated.

The repair control block 120 includes a first control unit 121 and a second control unit 122.

The first control unit 121 includes a plurality of inverters IV6 to IV10, a PMOS transistor P3, and NAND gates ND1 and ND2.

The inverter IV6 invertingly drives the first smart refresh signal SR_FLAG(1ST) according to active signals ACTP and ACTPB. The active signal ACTPB is an inverted signal of the active signal ACTP. The PMOS transistor P3 is electrically coupled between the power supply terminal and a node NODE2, and is applied with the power-up signal PWRUP through the gate terminal thereof. The inverters IV7 and IV8, electrically coupled in a latch structure, latch the output signal of the node NODE2 according to the active signals ACTP and ACTPB.

Accordingly, the first control unit 121 latches the first smart refresh signal SR_FLAG(1ST) according to the active signals ACTP and ACTPB.

The NAND gate ND1 NANDs or performs a NAND logic function on the bank select signal BKSELP and the repair signal RED_SUM. The NAND gate ND2 NANDs or performs a NAND logic function on the output of the inverter IV7 and an inverted output signal generated by inverting the output signal of the NAND gate ND1 by the inverter IV9. The inverter IV10 inverts the output of the NAND gate ND2, and outputs the repair control signal 1ST_RED.

Where a first row hammer address is a repaired address, the repair signal RED_SUM becomes a high level and the bank select signal BKSELP for selecting a corresponding bank is activated to a high level. According to this fact, where a first row hammer address is a repaired address, the repair control signal 1ST_RED is activated to a high level.

The second control unit 122 includes a plurality of inverters IV11 to IV14, a PMOS transistor P4, and a NAND gate ND3.

The inverter IV11 invertingly drives the repair signal RED_SUM according to repair control signals 1ST_RED and 1STB_RED. The repair control signal 1STB_RED is an inverted signal of the repair control signal 1ST_RED. The PMOS transistor P4 is electrically coupled between the power supply terminal and a node NODE3, and is applied with the power-up signal PWRUP through the gate terminal thereof. The inverters IV12 and IV13, electrically coupled in a latch structure, latch the output signal of the node NODE3 according to the repair control signals 1ST_RED and 1STB_RED.

The NAND gate ND3 NANDs or performs a NAND logic function on the second smart refresh signal SR_FLAG(2ND) and the output signal of the inverter IV12. The inverter IV14 invertingly drives the output of the NAND gate ND3, and outputs the repair control signal SR2ND_RED.

If the second smart refresh signal SR_FLAG(2ND) is activated to the high level in the state where the repair control signal 1ST_RED is activated to the high level, the repair control signal SR2ND_RED for a bank for which smart refresh is to be performed is activated accordingly.

The second control unit 122 stores a first row hammer address in the latch IV12 and IV13 where the first row hammer address is a repaired address, and activates and outputs the repair control signal SR2ND_RED when the second smart refresh signal SR_FLAG(2ND) is activated to the high level.

Figure 6:
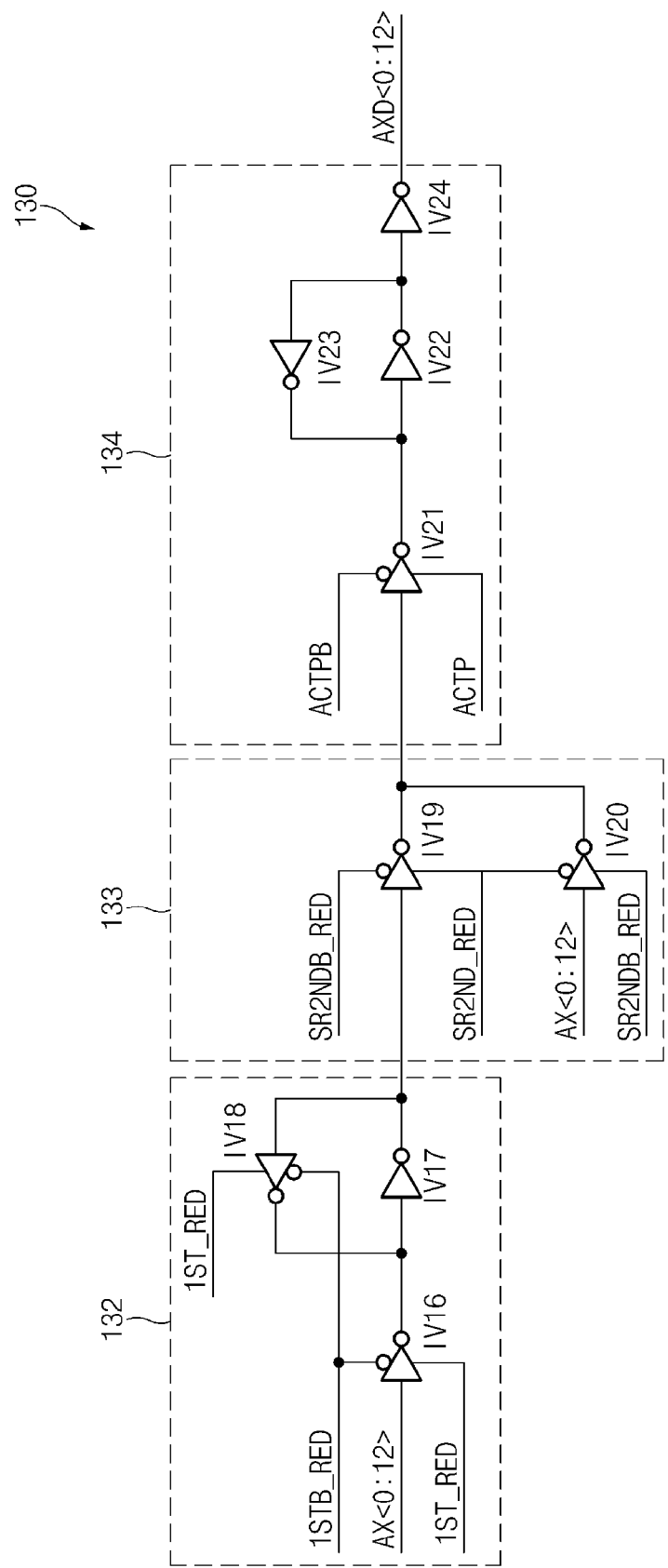
FIG. 6 is a detailed circuit diagram illustrating a representation of an example of the repair address storage block shown in FIG. 2.

Referring to FIG. 6, a detailed circuit diagram illustrating a representation of an example of the repair address storage block 130 shown in FIG. 2 is illustrated.

The repair address storage block 130 includes a latch unit 132, a selection unit 133, and an output unit 134.

The latch unit 132 includes a plurality of inverters IV16 to IV18. The inverter IV16 invertingly drives the row address AX<0:12> according to the repair control signals 1ST_RED and 1STB_RED. The inverters IV17 and IV18, which have a latch structure, latch the output of the inverter IV16 according to the repair control signals 1ST_RED and 1STB_RED.

A latch unit 132 latches the row address AX<0:12> according to the repair control signals 1ST_RED and 1STB_RED. If an inputted address is a repair address and the second smart refresh signal SR_FLAG(2ND) becomes the high level, the repair control signal SR2ND_RED is activated to a high level.

The selection unit 133 includes a plurality of inverters IV19 and IV20. The inverter IV19 invertingly drives the output of the inverter IV17 according to repair control signals SR2ND_RED and SR2NDB_RED. The inverter IV20 invertingly drives the row address AX<0:12> according to the repair control signals SR2ND_RED and SR2NDB_RED. The inverter IV19 and the inverter IV20 operate complementarily.

For example, where the repair control signal SR2ND_RED is the high level, the inverter IV19 is turned on and invertingly drives the output of the inverter IV17. Conversely, where the repair control signal SR2ND_RED is a low level, the inverter IV20 is turned on and invertingly drives the row address AX.

When the first smart refresh signal SR_FLAG(1ST) is activated, the row address AX is latched according to the repair control signal 1ST_RED. Where the repair control signal SR2ND_RED generated by the second smart refresh signal SR_FLAG(2ND) is the high level, a selected address corresponds to a repaired address. Thus, the row address AX inputted by the adder/subtracter 101 is not selected, and the address stored in the latch unit 132 is selected.

The output unit 134 includes a plurality of inverters IV21 to IV24. The inverter IV21 invertingly drives the outputs of the inverters IV19 and IV20 according to the active signals ACTP and ACTPB. The inverters IV22 and IV23, which have a latch structure, latch the output of the inverter IV21. The inverter IV24 invertingly drives the output of the inverter IV22 and outputs the latch address AXD<0:12>.

Figure 7:
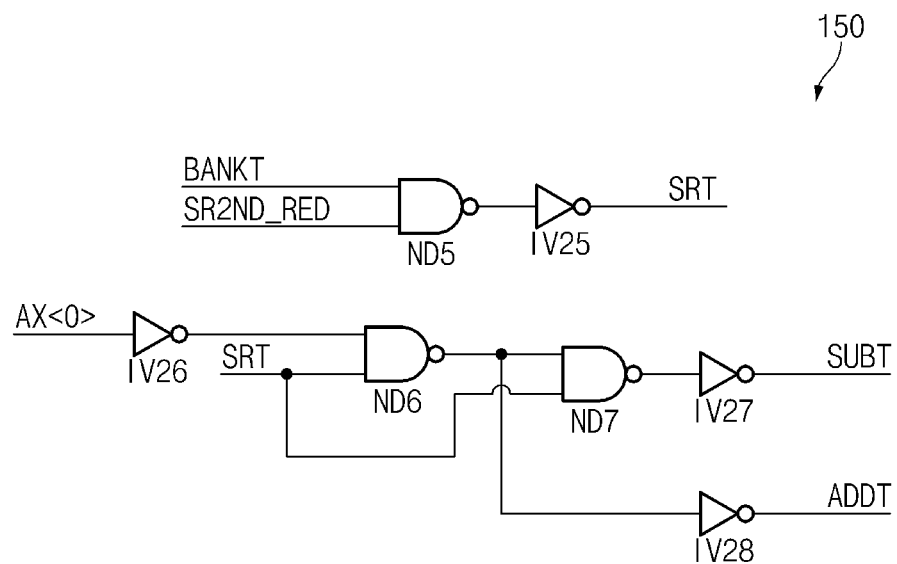
FIG. 7 is a detailed circuit diagram illustrating a representation of an example of the addition/subtraction signal generation block shown in FIG. 2.

Referring to FIG. 7, a detailed circuit diagram illustrating a representation of an example of the addition/subtraction signal generation block 150 shown in FIG. 2 is illustrated.

The addition/subtraction signal generation block 150 includes a plurality of NAND gates ND5 to ND7 and a plurality of inverters IV25 to IV28. The NAND gate ND5 NANDs or performs a NAND logic function on the bank activation signal BANKT and the repair control signal SR2ND_RED. The inverter IV25 inverts the output of the NAND gate ND5 and outputs the smart refresh command signal SRT.

Where both the bank activation signal BANKT and the repair control signal SR2ND_RED are high levels, the smart refresh command signal SRT is activated to a high level. Conversely, where the bank activation signal BANKT is the high level and the repair control signal SR2ND_RED is the low level, the smart refresh command signal SRT is deactivated to a low level.

The NAND gate ND6 NANDs or performs a NAND logic function on an inverted row address generated by inverting the row address AX<0> by the inverter IV26 and the smart refresh command signal SRT. The NAND gate ND7 NANDs or performs a NAND logic function on the output of the NAND gate ND6 and the smart refresh command signal SRT. The inverter IV27 inverts the output of the NAND gate ND7 and outputs the subtraction signal SUBT. The inverter IV28 inverts the output of the NAND gate ND6 and outputs the addition signal ADDT.

Accordingly, where the row address AX<0> is the logic "0," the addition signal ADDT becomes a high level and the subtraction signal SUBT becomes a low level. Conversely, where the row address AX<0> is the logic "1," the addition signal ADDT becomes a low level and the subtraction signal SUBT becomes a high level. Where the smart refresh command signal SRT is the low level, both the addition signal ADDT and the subtraction signal SUBT become the low levels.

Figure 8:
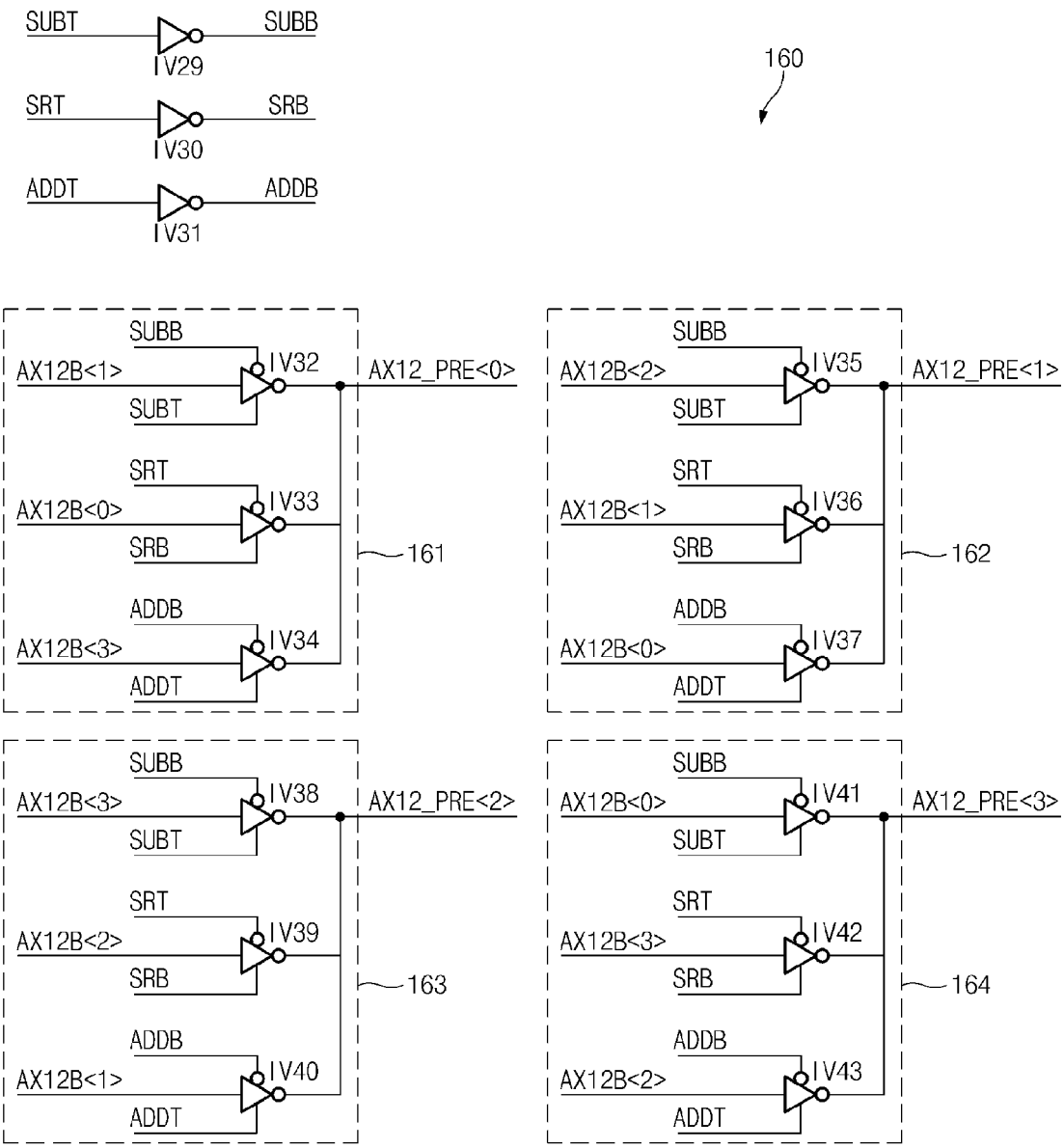
FIGS. 8 to 10 are detailed circuit diagrams illustrating a representation of an example of the operator shown in FIG. 2.
Figure 9:
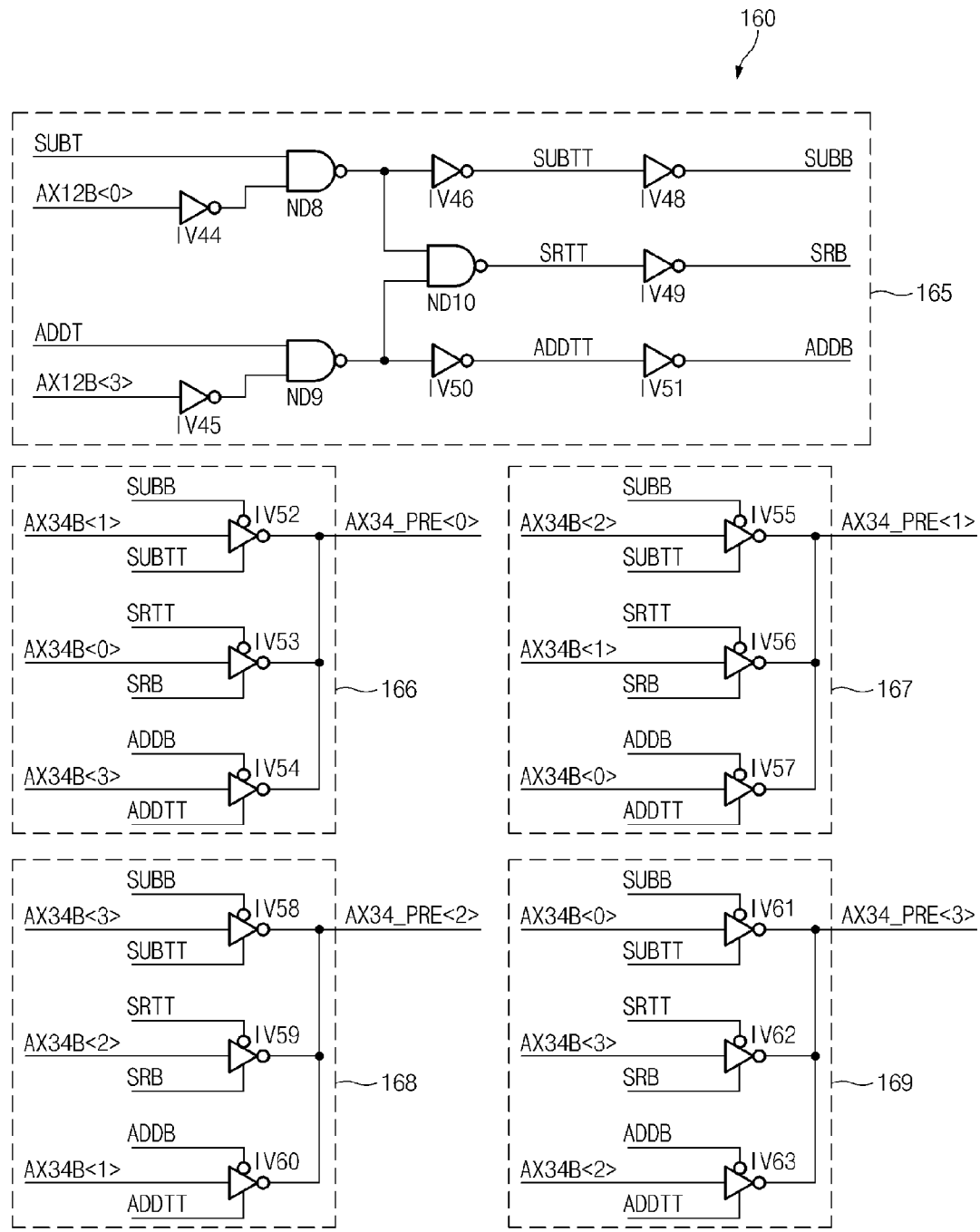
Figure 10:
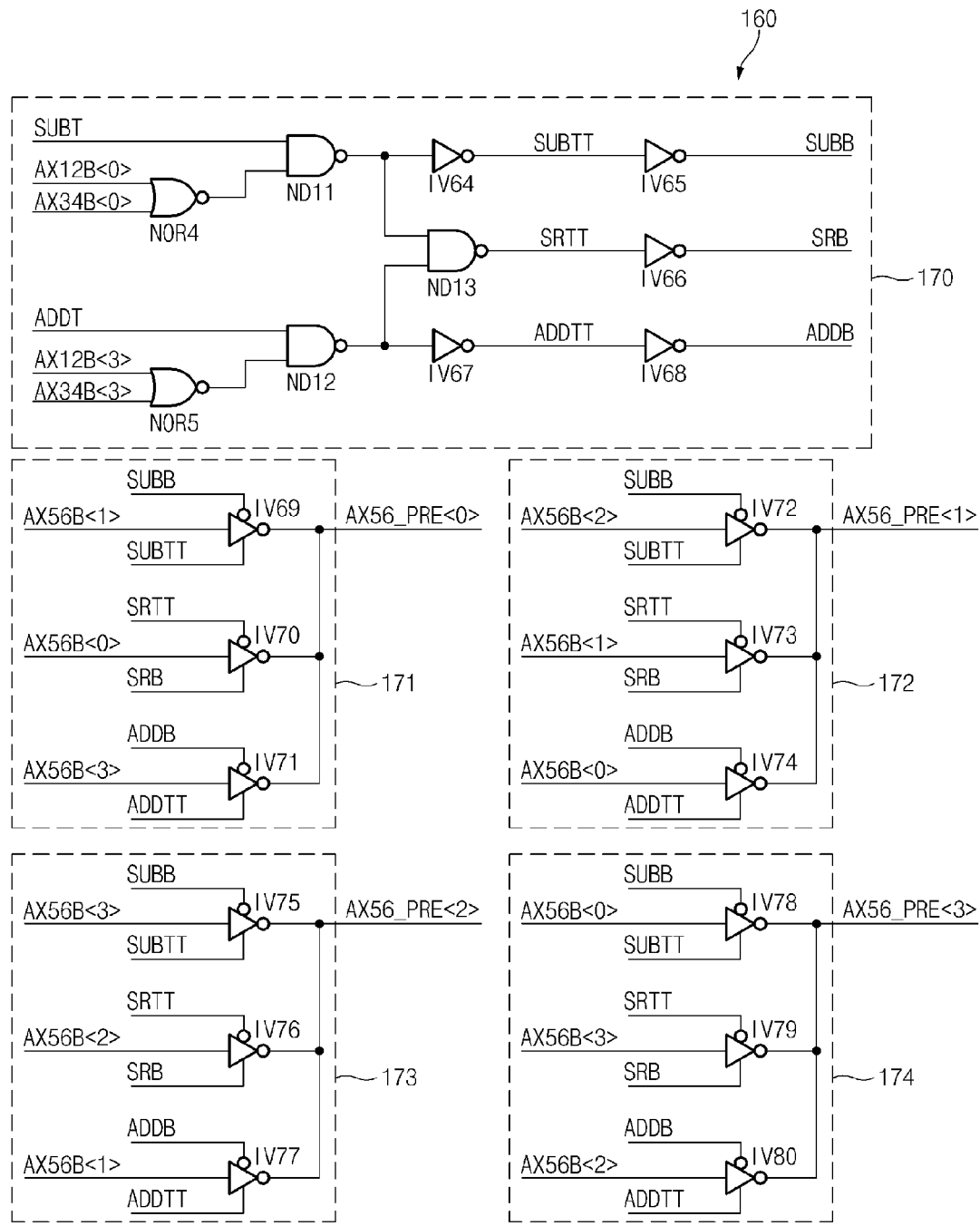

Referring to FIGS. 8 to 10, detailed circuit diagrams illustrating a representation of an example of the operator 160 shown in FIG. 1 are illustrated.

First, in FIG. 8, the operator 160 includes a first addition/subtraction unit 161 to a fourth addition/subtraction unit 164.

The first addition/subtraction unit 161 includes a plurality of inverters IV32 to IV34.

The inverter IV32 inverts a decoding signal AX12B<1> according to subtraction signals SUBT and SUBB, and outputs an address AX12_PRE<0>. The subtraction signal SUBB is a signal generated by inverting the subtraction signal SUBT by an inverter IV29.

The inverter IV33 inverts a decoding signal AX12B<0> according to smart refresh command signals SRT and SRB, and outputs the address AX12_PRE<0>. The smart refresh command signal SRB is a signal generated by inverting the smart refresh command signal SRT by an inverter IV30.

The inverter IV34 inverts a decoding signal AX12B<3> according to addition signals ADDT and ADDB, and outputs the address AX12_PRE<0>. The addition signal ADDB is a signal generated by inverting the addition signal ADDT by an inverter IV31.

The second addition/subtraction unit 162 includes a plurality of inverters IV35 to IV37.

The inverter IV35 inverts a decoding signal AX12B<2> according to the subtraction signals SUBT and SUBB, and outputs an address AX12_PRE<1>. The inverter IV36 inverts the decoding signal AX12B<1> according to the smart refresh command signals SRT and SRB, and outputs the address AX12_PRE<1>. The inverter IV37 inverts the decoding signal AX12B<0> according to the addition signals ADDT and ADDB, and outputs the address AX12_PRE<1>.

The third addition/subtraction unit 163 includes a plurality of inverters IV38 to IV40.

The inverter IV38 inverts the decoding signal AX12B<3> according to the subtraction signals SUBT and SUBB, and outputs an address AX12_PRE<2>. The inverter IV39 inverts the decoding signal AX12B<2> according to the smart refresh command signals SRT and SRB, and outputs the address AX12_PRE<2>. The inverter IV40 inverts the decoding signal AX12B<1> according to the addition signals ADDT and ADDB, and outputs the address AX12_PRE<2>.

The fourth addition/subtraction unit 164 includes a plurality of inverters IV41 to IV43.

The inverter IV41 inverts the decoding signal AX12B<0> according to the subtraction signals SUBT and SUBB, and outputs an address AX12_PRE<3>. The inverter IV42 inverts the decoding signal AX12B<3> according to the smart refresh command signals SRT and SRB, and outputs the address AX12_PRE<3>. The inverter IV43 inverts the decoding signal AX12B<2> according to the addition signals ADDT and ADDB, and outputs the address AX12_PRE<3>.

Next, in FIG. 9, the operator 160 includes a control signal generation unit 165, and a fifth addition/subtraction unit 166 to an eighth addition/subtraction unit 169.

The control signal generation unit 165 includes a plurality of NAND gates ND8 to ND10, and a plurality of inverters IV44 to IV51.

The NAND gate ND8 NANDs or performs a NAND logic function on the subtraction signal SUBT and an inverted decoding signal generated by inverting the decoding signal AX12B<0> by the inverter IV44. The NAND gate ND9 NANDs or performs a NAND logic function on the addition signal ADDT and an inverted decoding signal generated by inverting the decoding signal AX12B<3> by the inverter IV45. The inverter IV46 inverts the output of the NAND gate ND8, and outputs a subtraction signal SUBTT. The inverter IV48 inverts the subtraction signal SUBTT, and outputs the subtraction signal SUBB.

The NAND gate ND10 NANDs or performs a NAND logic function on the outputs of the NAND gates ND8 and ND9, and outputs a smart refresh command signals SRTT. The inverter IV49 inverts the smart refresh command signals SRTT, and outputs the smart refresh command signal SRB. The inverter IV50 inverts the output of the NAND gate ND9, and outputs an addition signal ADDTT. The inverter IV51 inverts the addition signal ADDTT, and outputs the addition signal ADDB.

In a control signal generation unit 165, if the decoding signal AX12B<0> is a low level and the subtraction signal SUBT is enabled to the high level, the subtraction signal SUBTT is activated and controls subtracting operations for decoding signals AX34B<0:3>. In addition, in the control signal generation unit 165, if the decoding signal AX12B<3> is a high level and the addition signal ADDT is enabled to the high level, the addition signal ADDTT is activated and controls adding operations for the decoding signals AX34B<0:3>.

The fifth addition/subtraction unit 166 includes a plurality of inverters IV52 to IV54.

The inverter IV52 inverts the decoding signal AX34B<1> according to the subtraction signals SUBTT and SUBB, and outputs an address AX34_PRE<0>. The inverter IV53 inverts the decoding signal AX34B<0> according to the smart refresh command signals SRTT and SRB, and outputs the address AX34_PRE<0>. The inverter IV54 inverts the decoding signal AX34B<3> according to the addition signals ADDTT and ADDB, and outputs the address AX34_PRE<0>.

The sixth addition/subtraction unit 167 includes a plurality of inverters IV55 to IV57.

The inverter IV55 inverts the decoding signal AX34B<2> according to the subtraction signals SUBTT and SUBB, and outputs an address AX34_PRE<1>. The inverter IV56 inverts the decoding signal AX34B<1> according to the smart refresh command signals SRTT and SRB, and outputs the address AX34_PRE<1>. The inverter IV57 inverts the decoding signal AX34B<0> according to the addition signals ADDTT and ADDB, and outputs the address AX34_PRE<1>.

The seventh addition/subtraction unit 168 includes a plurality of inverters IV58 to IV60.

The inverter IV58 inverts the decoding signal AX34B<3> according to the subtraction signals SUBTT and SUBB, and outputs an address AX34_PRE<2>. The inverter IV59 inverts the decoding signal AX34B<2> according to the smart refresh command signals SRTT and SRB, and outputs the address AX34_PRE<2>. The inverter IV60 inverts the decoding signal AX34B<1> according to the addition signals ADDTT and ADDB, and outputs the address AX34_PRE<2>.

The eighth addition/subtraction unit 169 includes a plurality of inverters IV61 to IV63.

The inverter IV61 inverts the decoding signal AX34B<0> according to the subtraction signals SUBTT and SUBB, and outputs an address AX34_PRE<3>. The inverter IV62 inverts the decoding signal AX34B<3> according to the smart refresh command signals SRTT and SRB, and outputs the address AX34_PRE<3>. The inverter IV63 inverts the decoding signal AX34B<2> according to the addition signals ADDTT and ADDB, and outputs the address AX34_PRE<3>.

Successively, in FIG. 10, the operator 160 includes a control signal generation unit 170, and a ninth addition/subtraction unit 171 to a twelfth addition/subtraction unit 174.

The control signal generation unit 170 includes a plurality of NAND gates ND11 to ND13, a plurality of NOR gates NOR4 and NOR5, and a plurality of inverters IV64 to IV68.

The NOR gate NOR4 NORs or performs a NOR logic function on the decoding signals AX12B<0> and AX34B<0>. The NOR gate NOR5 NORs or performs a NOR logic function on the decoding signals AX12B<3> and AX34B<3>. The NAND gate ND11 NANDs or performs a NAND logic function on the subtraction signal SUBT and the output of the NOR gate NOR4. The NAND gate ND12 NANDs or performs a NAND logic function on the addition signal ADDT and the output of the NOR gate NOR5. The inverter IV64 inverts the output of the NAND gate ND11, and outputs the subtraction signal SUBTT. The inverter IV65 inverts the subtraction signal SUBTT, and outputs the subtraction signal SUBB.

The NAND gate ND13 NANDs or performs a NAND logic function on the outputs of the NAND gates ND11 and ND12, and outputs the smart refresh command signal SRTT. The inverter IV66 inverts the smart refresh command signal SRTT, and outputs the smart refresh command signal SRB. The inverter IV67 inverts the output of the NAND gate ND12, and outputs the addition signal ADDTT. The inverter IV68 inverts the addition signal ADDTT, and outputs the addition signal ADDB.

In a control signal generation unit 170, only where the decoding signal AX12B<0> and the decoding signal AX34B<0> are low levels and the subtraction signal SUBT is enabled to the high level, the subtraction signal SUBTT is activated and controls subtracting operations for decoding signals AX56B<0:3>. Further, in the control signal generation unit 170, only where the decoding signal AX12B<3> and the decoding signal AX34B<3> are high levels and the addition signal ADDT is enabled to the high level, the addition signal ADDTT is activated and controls adding operations for the decoding signals AX56B<0:3>.

The ninth addition/subtraction unit 171 includes a plurality of inverters IV69 to IV71.

The inverter IV69 inverts the decoding signal AX56B<1> according to the subtraction signals SUBTT and SUBB, and outputs an address AX56_PRE<0>. The inverter IV70 inverts the decoding signal AX56B<0> according to the smart refresh command signals SRTT and SRB, and outputs the address AX56_PRE<0>. The inverter IV71 inverts the decoding signal AX56B<3> according to the addition signals ADDTT and ADDB, and outputs the address AX56_PRE<0>.

The tenth addition/subtraction unit 172 includes a plurality of inverters IV72 to IV74.

The inverter IV72 inverts the decoding signal AX56B<2> according to the subtraction signals SUBTT and SUBB, and outputs an address AX56_PRE<1>. The inverter IV73 inverts the decoding signal AX56_PRE<1> according to the smart refresh command signals SRTT and SRB, and outputs the address AX56_PRE<1>. The inverter IV74 inverts the decoding signal AX56B<0> according to the addition signals ADDTT and ADDB, and outputs the address AX56_PRE<1>.

The eleventh addition/subtraction unit 173 includes a plurality of inverters IV75 to IV77.

The inverter IV75 inverts the decoding signal AX56B<3> according to the subtraction signals SUBTT and SUBB, and outputs an address AX56_PRE<2>. The inverter IV76 inverts the decoding signal AX56B<2> according to the smart refresh command signals SRTT and SRB, and outputs the address AX56_PRE<2>. The inverter IV77 inverts the decoding signal AX56B<1> according to the addition signals ADDTT and ADDB, and outputs the address AX56_PRE<2>.

The twelfth addition/subtraction unit 174 includes a plurality of inverters IV78 to IV80.

The inverter IV78 inverts the decoding signal AX56B<0> according to the subtraction signals SUBTT and SUBB, and outputs an address AX56_PRE<3>. The inverter IV79 inverts the decoding signal AX56B<3> according to the smart refresh command signals SRTT and SRB, and outputs the address AX56_PRE<3>. The inverter IV80 inverts the decoding signal AX56B<2> according to the addition signals ADDTT and ADDB, and outputs the address AX56_PRE<3>.

Where addresses corresponding to the decoding signals AX12B<0:3>, AX34B<0:3> and AX56B<0:3> are added or subtracted according to the phase of the row address AX<0> and are outputted as the addresses AX12_PRE<0:3>, AX34_PRE<0:3> and AX56_PRE<0:3> in FIGS. 8 to 10 may be represented as in the following tables.

Table 1 represents the case where addresses corresponding to the decoding signals AX12B<0:3> (decoding signals of a first group) are added or subtracted and are outputted as the addresses AX12_PRE<0:3>.

TABLE 1

|  | SRT | SUB | ADD |
| --- | --- | --- | --- |
| AX12B<0> | AX12_PRE<0> | AX12_PRE<3> | AX12_PRE<1> |
| AX12B<1> | AX12_PRE<1> | AX12_PRE<0> | AX12_PRE<2> |
| AX12B<2> | AX12_PRE<2> | AX12_PRE<1> | AX12_PRE<3> |
| AX12B<3> | AX12_PRE<3> | AX12_PRE<2> | AX12_PRE<0> |

Table 2 represents the case where addresses corresponding to the decoding signals AX34B<0:3> (decoding signals of a second group) are added or subtracted and are outputted as the addresses AX34_PRE<0:3>.

TABLE 2

|  | SRT | SUB | ADD |
| --- | --- | --- | --- |
| AX34B<0> | AX34_PRE<0> | AX34_PRE<3> | AX34_PRE<1> |
| AX34B<1> | AX34_PRE<1> | AX34_PRE<0> | AX34_PRE<2> |
| AX34B<2> | AX34_PRE<2> | AX34_PRE<1> | AX34_PRE<3> |
| AX34B<3> | AX34_PRE<3> | AX34_PRE<2> | AX34_PRE<0> |

Table 3 represents where addresses corresponding to the decoding signals AX56B<0:3> (decoding signals of a third group) are added or subtracted and are outputted as the addresses AX56_PRE<0:3>.

TABLE 3

|  | SRT | SUB | ADD |
| --- | --- | --- | --- |
| AX56B<0> | AX56_PRE<0> | AX56_PRE<3> | AX56_PRE<1> |
| AX56B<1> | AX56_PRE<1> | AX56_PRE<0> | AX56_PRE<2> |
| AX56B<2> | AX56_PRE<2> | AX56_PRE<1> | AX56_PRE<3> |
| AX56B<3> | AX56_PRE<3> | AX56_PRE<2> | AX56_PRE<0> |

For example, where the first row hammer address AX<0> is the logic "0," the addition signal ADDT is activated. Accordingly, the row addresses AX12B, AX34B and AX56B<0, 1, 2, 3> are added to the addresses AX12_PRE, AX34_PRE and AX56_PRE<1, 2, 3, 0>.

Conversely, where the first row hammer address AX<0> is the logic "1," the subtraction signal SUBT is activated. Accordingly, the row addresses AX12B, AX34B and AX56B<0, 1, 2, 3> are subtracted to the addresses AX12_PRE, AX34_PRE and AX56_PRE<3, 0, 1, 2>.

Figure 11:
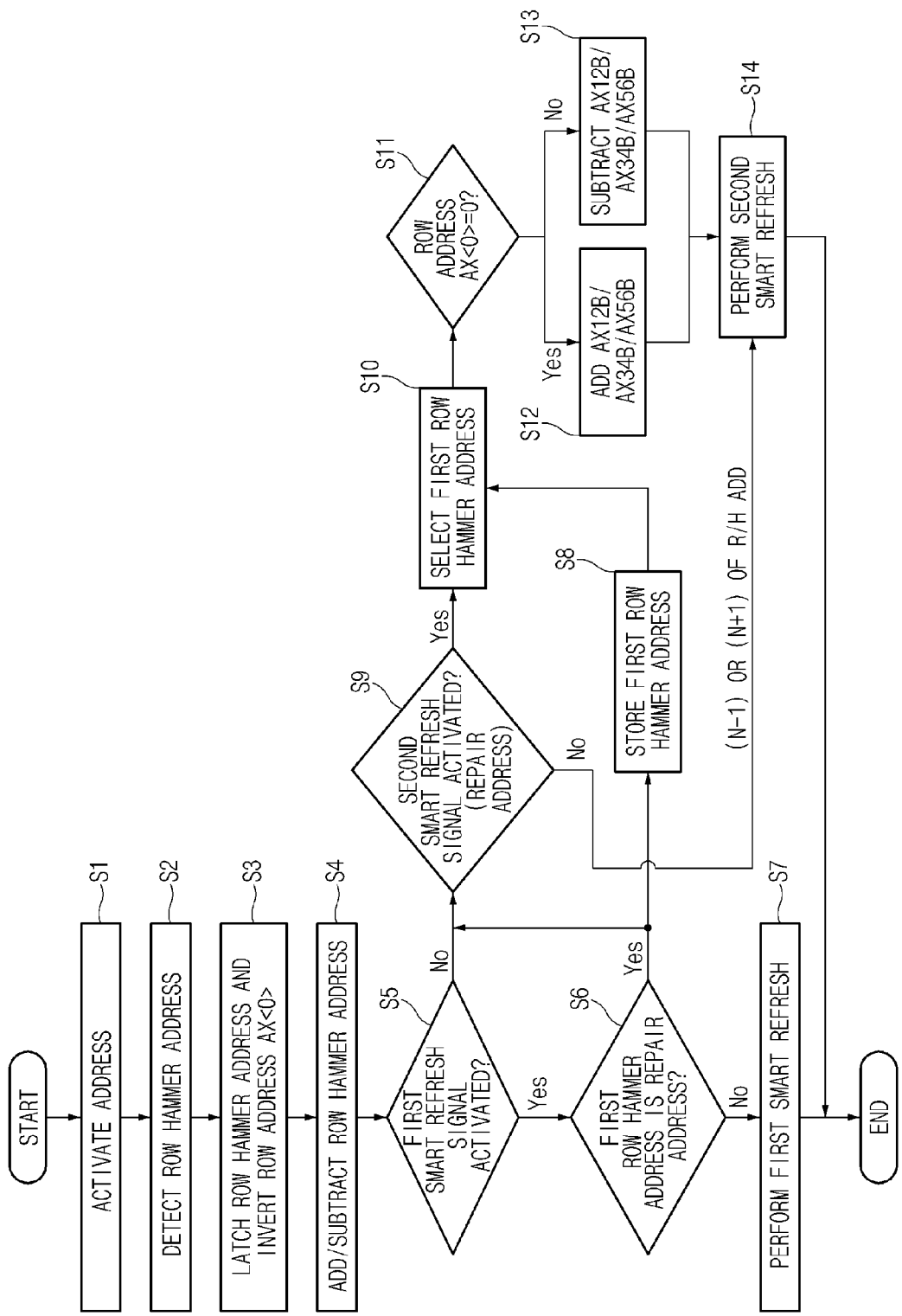
FIG. 11 is a representation of an example of a flow chart to assist in the explanation of the operations of the smart refresh device in accordance with an embodiment.

Referring to FIG. 11, a representation of an example of a flow chart to assist in the explanation of the operations of the smart refresh device in accordance with an embodiment is illustrated.

First, when an address ADD is activated and inputted (S1), the address control block 100 determines whether the corresponding address is a row hammer address (S2). Then, the address control block 100 latches the row hammer address and inverts a row address AX<0> (S3). The adder/subtracter 101 adds or subtracts the row hammer address (S4).

The smart refresh signal generation block 110 activates a first smart refresh signal SR_FLAG(1ST) (S5). If the first smart refresh signal SR_FLAG(1ST) is activated, the repair control block 120 determines whether the first row hammer address is a repair address, according to the repair signal RED_SUM applied from the fuse block 140 (S6).

Where the row hammer address is not a repair address, the repair control block 180 performs first smart refresh (S7). Where the row hammer address is a repair address, the repair address storage block 130 stores the first row hammer address (S8).

Next, the smart refresh signal generation block 110 activates a second smart refresh signal SR_FLAG(2ND) (S9). The repair address storage block 130 selects and outputs the first row hammer address where the row hammer address is a repair address (S10).

Thereafter, the addition/subtraction signal generation block 150 determines whether the row address AX<0> is the logic "0" or the logic "1" (S11).

Where the row address AX<0> is the logic "0," the operator 160 adds the decoding signals AX12B, AX34B and AX56B and outputs the addresses AX12_PRE, AX34_PRE and AX56_PRE (S12).

Figure 12:
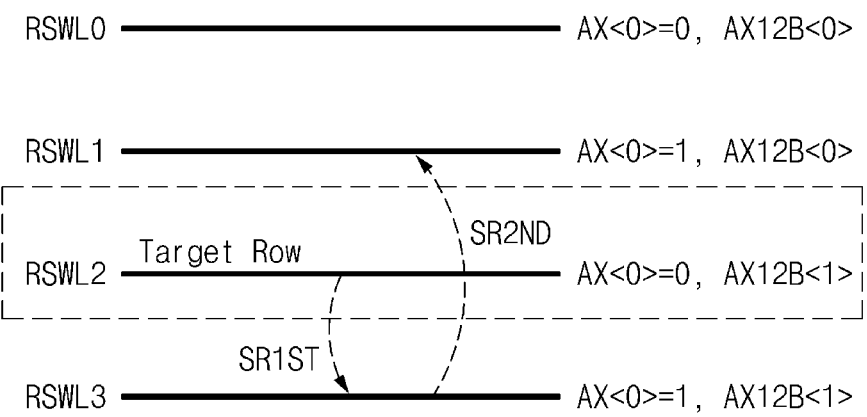
FIGS. 12 and 13 are representations of examples of diagrams to assist in the explanation of adding and subtracting operations in FIG. 11.

For example, referring FIG. 12, it is assumed that a target row line is a word line RSWL2 among repair word lines RSWL0 to RSWL3. In a first smart refresh operation SR1ST, the row address AX<0>=0 is inverted, and the adjacent word line RSWL3 with the row address AX<0>=1 is refreshed and latched. In a second smart refresh operation SR2ND, as the subtraction signal SUBT is activated, the decoding signal AX12B<1> is subtracted to be the decoding signal AX12B<0>, and the word line RSWL1 is refreshed.

Conversely, where the row address AX<0> is the logic "1," the operator 160 subtracts the decoding signals AX12B, AX34B and AX56B and outputs the addresses AX12_PRE, AX34_PRE and AX56_PRE (S13).

Figure 13:
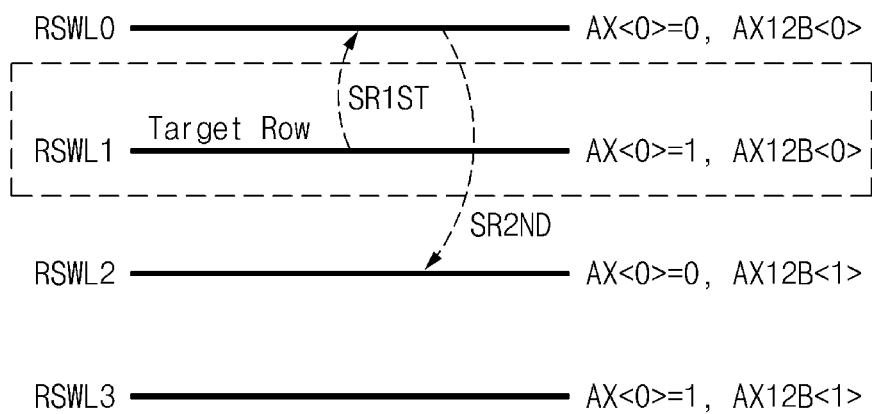

For example, referring to FIG. 13, it is assumed that a target row line is a word line RSWL1 among repair word lines RSWL0 to RSWL3. In a first smart refresh operation SR1ST, the row address AX<0>=1 is inverted, and the adjacent word line RSWL0 with the row address AX<0>=0 is refreshed and latched. In a second smart refresh operation SR2ND, as the addition signal ADDT is activated, the decoding signal AX12B<0> is added to be the decoding signal AX12B<1>, and the word line RSWL2 is refreshed.

Then, the refresh control block 180 performs a smart refresh operation in correspondence to the addresses AX12_PRE, AX34_PRE and AX56_PRE (S14).

Figure 14:
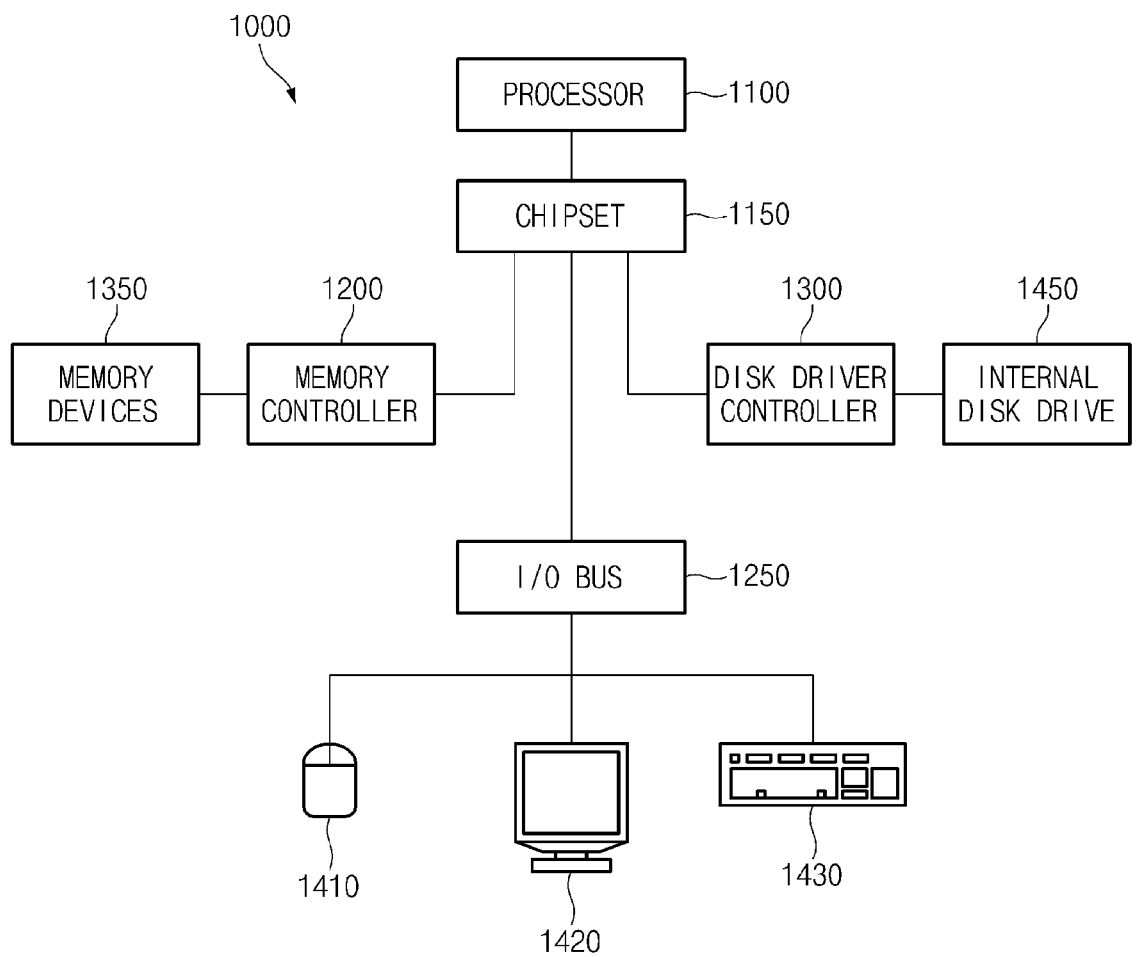
FIG. 14 illustrates a block diagram of a system employing a memory controller circuit in accordance with an embodiment of the invention.

Referring to FIG. 14, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the smart refresh device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

As is apparent from the above descriptions, in an embodiment, it is possible to prevent a refresh characteristic from being degraded when a data loss occurs due to row hammering, whereby it is possible to contribute to the improvement of the yield. In addition, since a cell data loss due to degradation of a refresh characteristic may be prevented, the reliability of a cell may be improved, and a degree to which data corruption due to row hammering is prevented may be increased.

While various embodiments have been described above, it will be understood to those skilled in the art that the embodiments described are by way of example only. Accordingly, the smart refresh device described should not be limited based on the described embodiments.

What is claimed is:

1. A smart refresh device comprising:
    an address control block configured to determine and store whether a specific row address is a row hammer address, and invert a first row hammer address and perform an addition/subtraction of an address;
    a repair control block configured to determine and store whether the row hammer address is a repaired address when a first smart refresh signal is activated, and output a stored repair address as a second repair control signal when a second smart refresh signal is activated;
    a repair address storage block configured to store an output address of the address control block when the first smart refresh signal is activated, and output a stored address as a latch address when the second repair control signal is activated;
    a fuse block configured to output a repair signal representing information on a repair address to the repair control block, and output a decoding signal according to the latch address; and
    an operator configured to add and subtract the decoding signal according to an addition signal and a subtraction signal when the second repair control signal is activated.

2. The smart refresh device according to claim 1, wherein the address control block comprises:
    an adder/subtracter configured to invert the first row hammer address and perform adding and subtracting operations for an address.

3. The smart refresh device according to claim 1, wherein the repair control block comprises:
    a first control unit configured to output a first repair control signal according to the repair signal when the first smart refresh signal is activated; and
    a second control unit configured to latch the repair signal when the first repair control signal is activated, and activate the latch address when the second repair control signal is activated.

4. The smart refresh device according to claim 1, wherein the repair address storage block comprises:
    a latch unit configured to latch the output address of the address control block when the first repair control signal is activated;
    a selection unit configured to select and output the address stored in the latch unit when the second repair control signal is activated; and
    an output unit configured to latch an output of the selection unit according to an active signal, and output the latch address.

5. The smart refresh device according to claim 1, further comprising:
    a refresh control block configured to perform a smart refresh according to an address adjacent to the specific row address when the first smart refresh signal is activated, and perform the smart refresh according to an address added or subtracted by the operator when the second smart refresh signal is activated.

6. The smart refresh device according to claim 1, further comprising:
    a smart refresh signal generation block configured to generate the first smart refresh signal and the second smart refresh signal.

7. The smart refresh device according to claim 6, wherein the smart refresh signal generation block activates a smart refresh signal when a flag signal and a refresh signal are activated, and deactivates the smart refresh signal when an external active signal is activated.

8. The smart refresh device according to claim 6, wherein the smart refresh signal generation block generates the first smart refresh signal and the second smart refresh signal in synchronization with a refresh command generated by a counter.

9. The smart refresh device according to claim 6, wherein the first smart refresh signal is activated 1 clock earlier than the second smart refresh signal.

10. The smart refresh device according to claim 1, further comprising:
   an addition/subtraction signal generation block configured to generate the subtraction signal, the addition signal and a smart refresh command signal according to the second repair control signal and a bank activation signal.

11. The smart refresh device according to claim 10, wherein the addition/subtraction signal generation block activates the smart refresh command signal when the bank activation signal and the second repair control signal are activated, and selectively activates the subtraction signal and the addition signal according to a logic level of the first row hammer address when the smart refresh command signal is activated.

12. The smart refresh device according to claim 1, wherein the operator selects a row address (an $N^{th}$ word line select signal) as N+1 as the addition signal is activated where the first row hammer address is a first logic level.

13. The smart refresh device according to claim 12, wherein the first logic level is a "low (0)" level.

14. The smart refresh device according to claim 1, wherein the operator selects a row address (an $N^{th}$ word line select signal) as N−1 as the subtraction signal is activated where the first row hammer address is a second logic level.

15. The smart refresh device according to claim 14, wherein the first logic level is a "high (1)" level.

16. The smart refresh device according to claim 1, wherein the operator comprises:
   a plurality of addition/subtraction units configured to add or subtract decoding signals of a first group according to the addition signal, the subtraction signal and a smart refresh command signal, and output added or subtracted addresses.

17. The smart refresh device according to claim 1, wherein the operator further comprises:
   a control signal generation unit configured to combine the addition signal, the subtraction signal and the decoding signals of a first group, and generate control signals; and
   a plurality of addition/subtraction units configured to add or subtract decoding signals of a second group according to the addition signal, the subtraction signal and a smart refresh command signal, and output added or subtracted addresses.

18. The smart refresh device according to claim 17, wherein the control signal generation unit controls a subtracting operation for the decoding signals of the second group when the decoding signals of the first group is a low level and the subtraction signal is enabled to a high level,
   wherein the control signal generation unit controls an adding operation for the decoding signals of the second group when the decoding signals of the first group is a high level and the addition signal is enabled to a high level.

19. The smart refresh device according to claim 1, wherein the operator further comprises:
   a control signal generation unit configured to combine the addition signal, the subtraction signal, decoding signals of a first group and decoding signals of a second group, and generate control signals; and
   a plurality of addition/subtraction units configured to add or subtract decoding signals of a third group according to the addition signal, the subtraction signal and a smart refresh command signal, and output added or subtracted addresses.

20. A smart refresh device comprising:
   an address control block configured to generate a row address according to an address and a smart refresh signal, and output the row address to a repair address storage block and an addition/subtraction signal generation block;
   a repair control block configured to output a repair control signal according to the smart refresh signal, an active signal, a bank select signal, and a repair signal;
   the repair address storage block configured to output a latch address to a fuse block according to a repair control signal, the active signal, and the row address; and
   the fuse block configured to output the decoding signals according to the latch address.

* * * * *